United States Patent [19]
Schucker et al.

[11] Patent Number: 5,440,249
[45] Date of Patent: Aug. 8, 1995

[54] VOLTAGE LEVEL TRANSLATOR CIRCUIT WITH CASCODED OUTPUT TRANSISTORS

[75] Inventors: Douglas W. Schucker, Mesa; Walter C. Seelbach, Fountain Hills, both of Ariz.

[73] Assignee: Motorola, Inc., Schaumburg, Ill.

[21] Appl. No.: 237,570

[22] Filed: May 3, 1994

[51] Int. Cl.$^6$ .................................... H03K 19/0185
[52] U.S. Cl. .................................... 326/81; 326/83
[58] Field of Search ............ 307/475, 451, 443, 296.5; 326/81, 83; 327/546

[56] References Cited

U.S. PATENT DOCUMENTS

| | | | |
|---|---|---|---|
| 4,689,504 | 8/1987 | Raghunathan | 307/449 |
| 4,996,443 | 2/1991 | Tateno | 307/475 |
| 5,204,557 | 4/1993 | Nguyen | 307/475 |
| 5,300,832 | 4/1994 | Rogers | 307/475 |

Primary Examiner—Edward P. Westin
Assistant Examiner—Benjamin D. Driscoll
Attorney, Agent, or Firm—Edward J. Mischen; Robert D. Atkins

[57] ABSTRACT

A voltage level translator circuit converts an input signal referenced between first and second operating potentials to an output signal referenced between second and third operating potentials. The input signal is level shifted through cascoded transistors and latched by series inverters to drive upper cascoded transistors in the output stage. The input signal is delayed before driving lower cascoded transistors in the output stage. The output stage transistors are cascoded in a similar manner as the level shifting section. The logic state of the input signal determines whether the upper cascoded transistors or the lower cascoded transistors in the output stage are activated to set the logic state of the output signal of the voltage level translator circuit. Additional cascoded transistors may be stacked to extend the range of voltage translation. The voltage level translator circuit is applicable to sub-micron technology.

9 Claims, 2 Drawing Sheets

VOLTAGE LEVEL TRANSLATOR CIRCUIT WITH CASCODED OUTPUT TRANSISTORS

BACKGROUND OF THE INVENTION

The present invention relates in general to voltage translator circuits, and more particularly, to a voltage level translator circuit with cascoded transistors.

Voltage level translator circuits are commonly used in digital design to convert a data signal from one voltage level to another voltage level that represents the same logic state. For example, in 0.5 sub-micron MOS technology, the voltage level for a logic one is typically 3.3 volts because of the lower power supply voltage. In higher micron MOS technology the voltage level for a logic one is 5.0 volts in accordance with its higher power supply voltage. In order to transition from one technology to another, it is necessary to level shift the voltage of the data signal to match the logic levels of the receiving technology.

In the prior art, level shifting diodes are commonly used to translate from one voltage level to another voltage level representing the same logic state. The diodes are stacked anode to cathode to achieve the desired level shifting. A problem occurs in that some of the level shifting transistors have the full higher power supply voltage across their gate oxide layer. In sub-micron MOS technology, the gate oxide layer cannot handle the higher voltage stresses.

Hence, a need exists to translate voltage levels in sub-micron MOS technologies without overstressing the gate oxide layers.

DETAILED DESCRIPTION OF THE DRAWINGS

Figure 1:
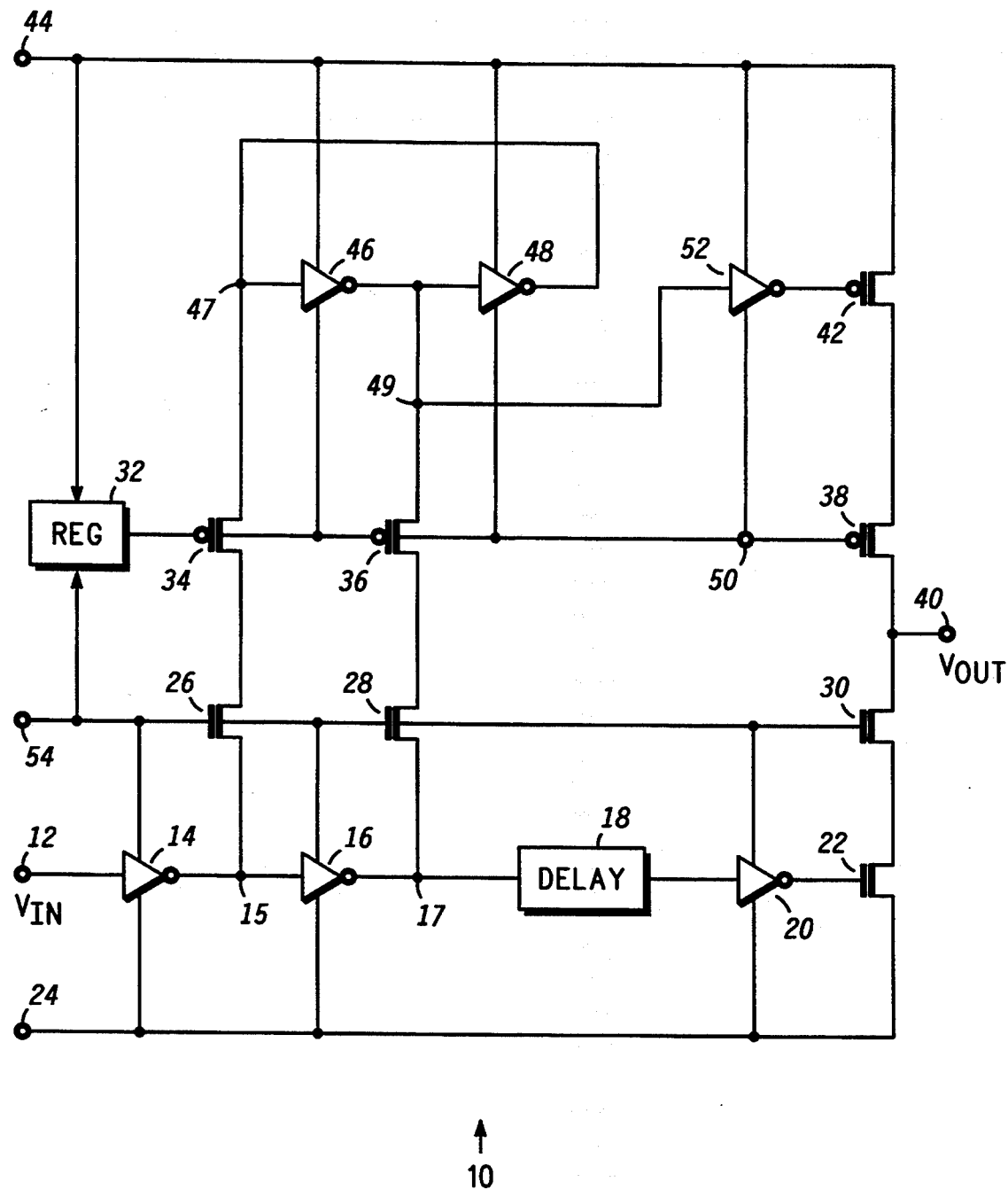
FIG. 1 is a schematic and block diagram illustrating a voltage level translator circuit.

Referring to FIG. 1, a voltage level translator circuit 10 is shown suitable for manufacturing as an integrated circuit using conventional integrated circuit processes. Voltage level translator circuit 10 converts a digital input signal $V_{IN}$ having a first voltage level indicating logic one to an output signal $V_{OUT}$ having a second voltage level indicating the same logic one. The voltage level indicating a logic zero is the same for $V_{IN}$ and $V_{OUT}$, i.e. ground potential. Voltage level translator circuit 10 is useful to transition from say 0.5 sub-micron MOS technology where a logic one is 3.3 volts to higher micron MOS technology where a logic one is 5.0 volts.

The input signal $V_{IN}$ operating between 0.0 volts for logic zero and 3.3 volts for logic one is applied to terminal 12 at an input of inverter 14. The output of inverter 14 is coupled to an input of inverter 16 at node 15. The output of inverter 16 is coupled to an input of delay circuit 18 at node 17. Delay circuit 18 may comprise an even number of serially coupled inverters (not shown) for providing a time delay. The output of delay circuit 18 is coupled through inverter 20 to the gate of n-channel transistor 22. The source of transistor 22 is coupled to power supply conductor 24 operating at ground potential. N-channel transistors 26, 28 and 30 each have a gate commonly coupled to terminal 54 for receiving a power supply operating potential of 3.3 volts. Transistor 26 has a source coupled to node 15, while transistor 28 has a source coupled to node 17. The source of transistor 30 is coupled to the drain of transistor 22. Inverters 14, 16 and 20 receive operating potentials from terminals 54 and 24.

A voltage regulator circuit 32 receives one power supply operating potential from terminal 44 operating at 5.0 volts and another power supply operating potential of 3.3 volts from terminal 54. The output of regulator circuit 32 provides a tracking operating potential to the gates of p-channel transistors 34, 36 and 38 at node 50. The magnitude of the operating potential at node 50 is determined by operating potential terminals 54 and 44, i.e. $5.0 - 3.3 = 1.7$ volts with respect to power supply terminal 24, or conversely $-3.3$ volts with respect to power supply terminal 44.

The maximum gate-source, gate-drain and drain-source voltages for all transistors is limited to 3.3 volts. That is, with terminal 54 operating at 3.3 volts and node 50 operating at 1.7 volts, no transistor junction and/or gate oxide layer in the cascode arrangement is exposed to more than 3.3 volts. For example, even through the source of transistor 34 may reach 5.0 volts when the output of inverter 48 goes to logic one, its gate receives 1.7 volts which limits the maximum voltage across the gate-source junction to 3.3 volts. The voltage level translation process thus does not cause any of the 0.5 sub-micron MOS transistors to exceed its maximum junction voltage rating, i.e. 3.3 volts. Inverters 46, 48 and 52 receive operating potentials from terminal 44 and node 50.

Continuing with FIG. 1, the drain of transistor 34 is coupled to the drain of transistor 26, while the drain of transistor 36 is coupled to the drain of transistor 28. The drain of transistor 38 is coupled to the drain of transistor 30 at output 40 for providing the output signal $V_{OUT}$. The source of transistor 34 is coupled to an input of inverter 46 at node 47. The output of inverter 46 is coupled to an input of inverter 48 at node 49. The source of transistor 36 is also coupled to node 49 and to an input of inverter 52. The output of inverter 48 is coupled back to node 47. The output of inverter 52 is coupled to the gate of transistor 42. P-channel transistor 42 includes a source coupled to operating potential terminal 44 and a drain coupled to the source of transistor 38. Cascoded transistors 22 and 30, and cascoded transistors 38 and 42 form the output stage of voltage level translator circuit 10.

The output of inverter 46 goes to logic one when its input is 2.3 volts and to logic zero when its input approaches 5.0 volts. Recall inverter 46 is referenced between 1.7 volts from node 50 and 5.0 volts from terminal 44. Likewise, the outputs of inverters 48 and 52 go to logic one with inputs at 2.3 volts and to logic zero when the input approaches 5.0 volts.

The operation of voltage level translator circuit 10 proceeds as follows. Assume the input signal $V_{IN}$ is logic zero, or ground potential. Node 15 goes to logic one (3.3 volts) and node 17 goes to logic zero (0.0 volts). Transistor 26 is non-conductive because the logic one at node 15 is substantially the same as the voltage on terminal 54. The gate-source potential ($V_{GS}$) of transistor 26 is substantially zero causing the device to turn off. Transistor 34 is off as well with no conduction path through transistor 26.

On the other hand, the logic zero at node 17 establishes a $V_{GS}$ of 3.3 volts for transistor 28 to turn the device on. Transistor 36 conducts and establishes approximately 2.3 volts at node 49 sufficient to set the outputs of inverters 48 and 52 to logic one. Cascode transistors 26 and 34 can only pull node 47 to logic zero. Similarly, cascode transistors 28 and 36 can only pull node 49 to logic zero. Consequently, inverters 46 and 48 are necessary to set node 47 to logic one when transistors 34 and 26 are non-conductive, and node 49 to logic one when transistors 28 and 36 are non-conductive. While transistor 34 is off, the logic one from inverter 48 feeds back and latches the output of inverter 46 to logic zero. The voltage at node 49 represents a second input signal referenced between operating potentials at terminal 44 and node 50. The logic one from inverter 52 makes transistor 2 non-conductive. Transistor 38 is also non-conductive because there is no conduction path through transistor 42 to terminal 44.

While the logic zero input signal $V_{IN}$ turns off transistors 38 and 42, the logic zero at node 17 propagates through delay circuit 18. Since n-channel transistors switch more rapidly than p-channel transistors, it is important to delay the n-channel switching path to ensure that transistors 42 and 22 switch at the same time and avoid short circuit currents between terminals 44 and 24 through transistors 42, 38, 30 and 22. Accordingly, the output of inverter 20 goes to logic one approximately two nanoseconds after node 17 goes to logic zero in order to align the gate signals to transistors 22 and 42. Transistor 22 turns on and completes the conduction path from output 40 through transistors 30 and 22 to terminal 24. The output signal $V_{OUT}$ goes to logic zero referenced to power supply terminal 24.

Now consider the input signal $V_{IN}$ at logic one, or approximately 3.3 volts. Node 15 goes to logic zero (0.0 volts) and node 17 goes to logic one (3.3 volts). Transistor 28 is non-conductive because the logic one at node 17 is substantially the same as the voltage on terminal 54. The $V_{GS}$ of transistor 28 is substantially zero causing the device to turn off. Transistor 36 is off as well with no conduction path through transistor 28.

The logic zero at node 15 establishes a $V_{GS}$ of 3.3 volts for transistor 26 to turn it on. Transistor 34 conducts and establishes approximately 2.3 volts at node 47 sufficient to set the output of inverter 46 to logic one. The outputs of inverters 48 and 52 each go to logic zero. The logic zero at node 47 is thus latched by inverters 46 and 48. Transistor 42 conducts with a logic zero from inverter 52. Transistor 38 also conducts and completes the conduction path between terminal 44 and output 40. The output signal $V_{OUT}$ goes to logic one referenced to operating potential terminal 44.

While the logic one input signal $V_{IN}$ turns on transistors 38 and 42, the logic one at node 17 propagates through delay circuit 18. The output of inverter 20 goes to logic zero approximately two nanoseconds after node 17 goes to logic one. Transistor 22 is non-conductive because of the logic zero from inverter 20. Transistor 30 is also non-conductive because there is no conduction path through transistor 22 to terminal 24.

Figure 2:
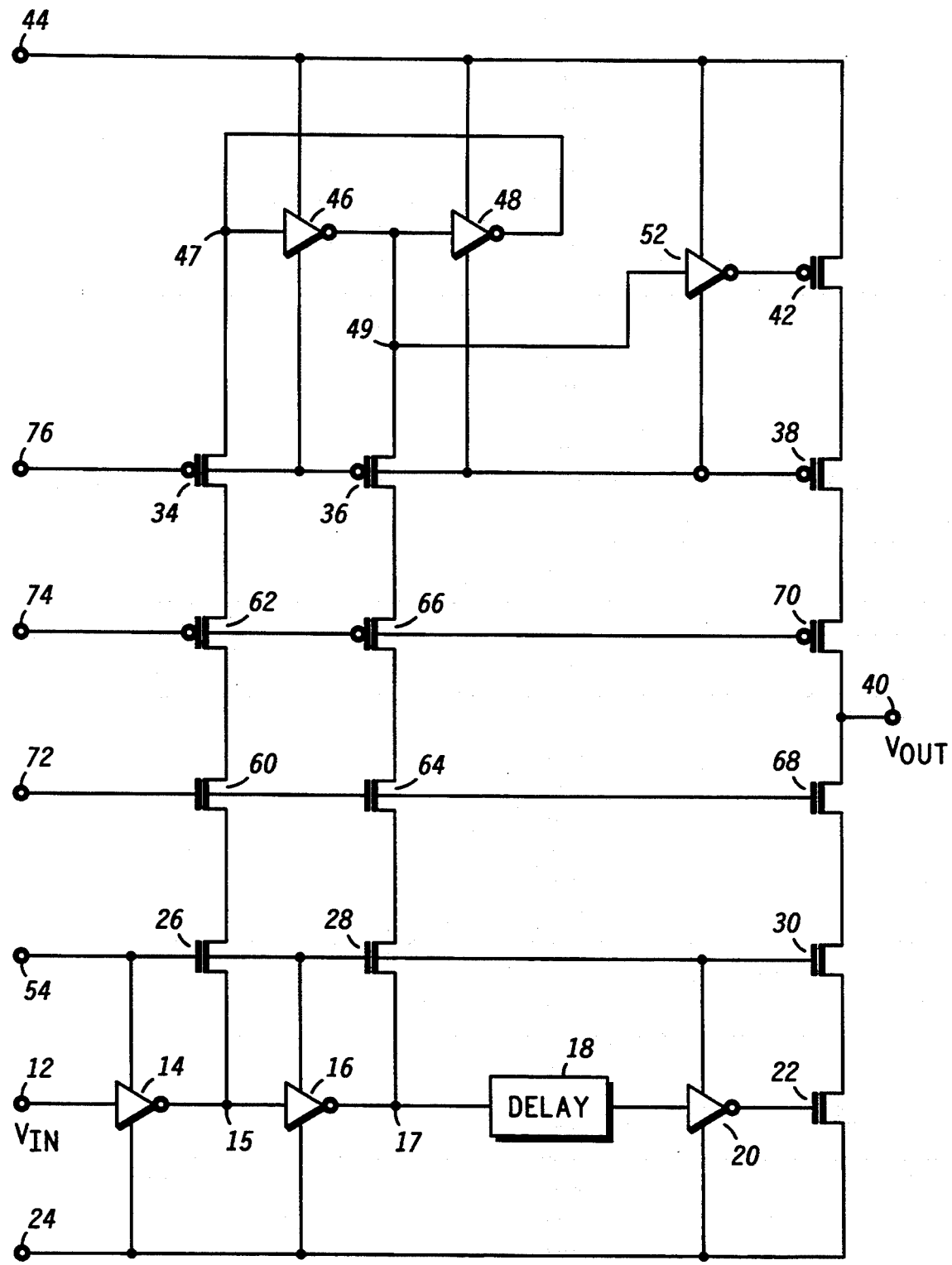
FIG. 2 is a schematic diagram illustrating an alternate embodiment of the voltage level translator circuit.

The voltage level translation range is limited to the maximum individual device characteristics of the cascoded transistors. The transistors used in the present embodiment are relative low voltage PMOS and NMOS 0.5 sub-micron technology. Further transistor cascoding may be used to expand the range of voltage level translation. For example as shown in FIG. 2, an alternate embodiment of the present invention includes four cascoded transistors in the voltage level translation section. It is also necessary to use a thicker gate oxide for the transistors in FIG. 2 sufficient to handle say 6.0 volts maximum voltage rating across its junctions. The extended cascode arrangement and greater maximum voltage rating allows a larger power supply potential for terminal 44. In the present embodiment, the operating potential at terminal 44 is set to 12.0 volts. Components having the same reference numbers used in FIG. 1 perform a similar function.

Transistor 60 has a source coupled to the drain of transistor 26 and a drain coupled to the drain of transistor 62. The source of transistor 62 is coupled to the drain of transistor 34. Transistor 64 has a source coupled to the drain of transistor 28 and a drain coupled to the drain of transistor 66. The source of transistor 66 is coupled to the drain of transistor 36. In the output stage, transistor 68 has a source coupled to the drain of transistor 30 and a drain coupled to the drain of transistor 70 at output terminal 40. The source of transistor 70 is coupled to the drain of transistor 38. The gates of transistors 60, 64 and 68 receive a power supply operating potential from terminal 72. The gates of transistors 62, 66 and 70 receive a power supply operating potential from terminal 74. The gates of transistors 34, 6 and 38 receive a power supply operating potential from terminal 76.

Cascoded output stage transistors 70 and 68 should be sized similar to transistors 38 and 42 and transistors 30 and 22, respectively, to ensure equal voltage division during the transient response. The equal voltage division is important in order to maintain drain-source transient stress below the maximum voltage rating ($V_{MAX}$) of 6.0 volts. The operating potential applied at terminal 72 is set to the $V_{MAX}$ of the transistor junctions, i.e. 6.0 volts. The operating potential applied at terminal 74 is set to the voltage on terminal 44 minus the $V_{MAX}$ of the transistor junctions, i.e. 12.0−6.0=6.0 volts. The power supply potential applied at terminal 76 is set to the voltage on terminal 44 minus the voltage on terminal 54, i. e. 12.0−3.3=8.7 volts. A regulator circuit (not shown) generates the above operating potentials for terminals 72, 74 and 76.

Assume the input signal $V_{IN}$ is logic zero, or ground potential. Node 15 goes to logic one (3.3 volts) and node 17 goes to logic zero (0.0 volts). Transistor 26 is non-conductive because the logic one at node 15 is substantially the same as the voltage on terminal 54. The gate-source potential ($V_{GS}$) of transistor 26 is substantially zero causing the device to turn off. Transistors 60, 62 and 34 are off as well with no conduction path through transistor 26.

The logic zero at node 17 establishes a $V_{GS}$ of 3.3 volts for transistor 28 to turn the device on. Transistors 64, 66 and 36 conduct and establish approximately 9.3 volts at node 49 sufficient to set the outputs of inverters 48 and 52 to logic one. Recall inverter 46 is referenced between 8.7 volts from terminal 76 and 12.0 volts from terminal 44. Cascode transistors 26, 60, 62 and 34 can only pull node 47 to logic zero. Similarly, cascode transistors 28, 64, 66 and 36 can only pull node 49 to logic zero. Consequently, inverters 46 and 48 are necessary to set node 47 to logic one when transistors 26, 60, 62 and 34 are non-conductive, and node 49 to logic one when transistors 28, 64, 66 and 36 are non-conductive. While transistors 60, 62 and 34 are off, the logic one from inverter 48 feeds back and latches the output of inverter 46 to logic zero. The voltage at node 49 represents a second input signal referenced between operating potentials at terminals 44 and 76. The logic one from inverter 52 makes transistor 42 non-conductive. Transistors 38 and 70 are also non-conductive because there is no conduction path through transistor 42 to terminal 44.

While the logic zero input signal $V_{IN}$ turns off transistors 70, 38 and 42, the logic zero at node 17 propagates through delay circuit 18. Since n-channel transistors switch more rapidly than p-channel transistors, it is important to delay the n-channel switching path to ensure that transistor 42 and 22 switch at the same time and avoid short circuit currents between terminals 44 and 24 through transistors 42, 38, 70, 68, 30 and 22. Accordingly, the output of inverter 20 goes to logic one approximately three-four nanoseconds after node 17 goes to logic zero in order to align the gate signals to transistors 22 and 42. Transistor 22 turns on and completes the conduction path from output 40 through transistors 68, 30 and 22 to terminal 24. The output signal $V_{OUT}$ goes to logic zero referenced to power supply terminal 24.

Now consider the input signal $V_{IN}$ at logic one, or approximately 3.3 volts. Node 15 goes to logic zero (0.0 volts) and node 17 goes to logic one (3.3 volts). Transistor 28 is non-conductive because the logic one at node 17 is substantially the same as the voltage on terminal 54. The $V_{GS}$ of transistor 28 is substantially zero causing the device to turn off. Transistors 64, 66 and 36 are off as well with no conduction path through transistor 28.

The logic zero at node 15 establishes a $V_{GS}$ of 3.3 volts for transistor 26 to turn it on. Transistor 60, 62 and 34 conduct and establish approximately 9.3 volts at node 47 sufficient to set the output of inverter 46 to logic one. The outputs of inverters 48 and 52 each go to logic zero. The logic zero at node 47 is thus latched by inverters 46 and 48. Transistor 42 conducts with a logic zero from inverter 52. Transistors 70 and 38 also conduct and complete the conduction path between terminal 44 and output 40. The output signal $V_{OUT}$ goes to logic one referenced to operating potential terminal 44.

While the logic one input signal $V_{IN}$ has turned on transistors 38, 70 and 42, the logic one at node 17 propagates through delay circuit 18. The output of inverter 20 goes to logic zero approximately three-four nanoseconds after node 17 goes to logic one. Transistor 22 is non-conductive because of the logic zero from inverter 20. Transistors 30 and 68 are also non-conductive because there is no conduction path through transistor 22 to terminal 24.

By now it should be appreciated that the present invention provides stress protection circuitry to allow a low voltage technology to communicate with higher voltage external components via the cascoded translator design. The translation may be performed on chip rather than being externally supplied by large and costly translator devices mounted on the circuit board. The cascoded transistors of complementary polarities and properly biased at their respective gates provide the electrical stress protection to all transistors when the output voltage excursions are greater than the maximum stress voltage permissible by the technology.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A voltage level translator circuit, comprising:
   a first transistor having a gate, a drain and a source, said gate being coupled for receiving a first input signal referenced between first and second operating potentials, said source being coupled for receiving said first operating potential;
   a second transistor having a gate, a drain and a source, said source being coupled to said drain of said first transistor, said gate being coupled for receiving said second operating potential;
   a third transistor having a gate, a drain and a source, said drain being coupled to said drain of said second transistor at an output of the voltage translator circuit, said gate being coupled for receiving a third operating potential;
   a fourth transistor having a gate, a drain and a source, said drain being coupled to said source of said third transistor, said source being coupled for receiving a fourth operating potential;
   circuit means for translating said first input signal to a second input signal referenced between said third and fourth operating potentials, said second input signal being applied to said gate of said fourth transistor, said circuit means further including,
   (a) a first inverter having an input coupled for receiving said first input signal and having an output at a first node,
   (b) a fifth transistor having a gate, a drain and a source, said gate being coupled for receiving said second operating potential, said source being coupled to said first node,
   (c) a second inverter having an input coupled to said output of said first inverter and having an output at a second node,
   (d) a sixth transistor having a gate, a drain and a source, said gate being coupled for receiving said second operating potentials, said source being coupled to said second node,
   (e) a voltage regulator circuit receiving said second and fourth operating potentials for providing said third operating potential,
   (f) a seventh transistor having a gate, a drain and a source, said gate being coupled for receiving said third operating potential, said drain being coupled to said drain of said fifth transistors, said source being coupled to a third node,
   (g) an eighth transistor having a gates, a drain and a source, said gate being coupled for receiving said third operating potential, said drain being coupled to said drain of said sixth transistor, said source being coupled to a fourth node,
   (h) a third inverter having an input coupled to said third node and having an output coupled to said fourth node,
   (i) a fourth inverter having an input coupled to said fourth node and having an output coupled to said third node, and
   (j) a fifth inverter having an input coupled to said fourth node and having an output coupled to said gate of said fourth transistors;
   delay circuit having an input coupled to said second node and having An output; and
   a sixth inverter having an input coupled to said output of said delay circuit and having an output coupled to said gate of said first transistor.

2. A method of voltage level translating, comprising the steps of:
   providing first and second operating potentials;

level shifting a first input signal referenced between said first and second operating potentials to a second input signal referenced between third and fourth operating potentials;

cascoding first and second output transistors respectively between said first operating potential and an output where a gate of said first transistor receives said first input signal and a gate of said second transistor receives said second operating potential;

cascoding third and fourth output transistors respectively between said output and said fourth operating potential where a gate of said third transistor receives said third operating potential and a gate of said fourth transistor receives said second input signal;

said level shifting step including the step of latching said second input signal at a gate of said fourth transistor;

inverting said first input signal for providing a first inverted input signal;

inverting said first inverted input signal for providing a second inverted input signal;

delaying said second inverted input signal for providing a delayed input signal; and inverting said delayed input signal for providing a third inverted input signal to said gate of said first transistor.

3. A voltage level translator circuit, comprising:
a first transistor having a gate, a drain and a source, said gate being coupled for receiving a first input signal referenced between first and second operating potentials, said source being coupled for receiving said first operating potential;

a second transistor having a gate, a drain and a source, said source being coupled to said drain of said first transistor, said gate being coupled for receiving said second operating potential;

a third transistor having a gate, a drain and a source, said source being coupled to said drain of said second transistor, said gate being coupled for receiving a third operating potential;

a fourth transistor having a gate, a drain and a source, said drain being coupled to said drain of said third transistor at an output of the voltage translator circuit, said gate being coupled for receiving a fourth operating potential;

a fifth transistor having a gate, a drain and a source, said drain being coupled to said source of said fourth transistor, said gate being coupled for receiving a fifth operating potential;

a sixth transistor having a gate, a drain and a source, said drain being coupled to said source of said fifth transistor, said source being coupled for receiving a sixth operating potential; and circuit means for translating said first input signal to a second input signal referenced between said fifth and sixth operating potentials, said second input signal being applied to said gate of said sixth transistor.

4. The voltage level translator circuit of claim 3 wherein said circuit means includes:

a first inverter having an input coupled for receiving said first input signal and having an output at a first node;

a seventh transistor having a gate, a drain and a source, said gate being coupled for receiving said second operating potential, said source being coupled to said first node; and an eighth transistor having a gate, a drain and a source, said gate being coupled for receiving said third operating potential, said source being coupled to said drain of said seventh transistor.

5. The voltage level translator circuit of claim 4 wherein said circuit means includes:

a second inverter having an input coupled to said output of said first inverter and having an output at a second node;

a ninth transistor having a gate, a drain and a source, said gate being coupled for receiving said second operating potential, said source being coupled to said second node; and a tenth transistor having a gate, a drain and a source, said gate being coupled for receiving said third operating potential, said source being coupled to said drain of said ninth transistor.

6. The voltage level translator circuit of claim 5 wherein said circuit means further includes:

an eleventh transistor having a gate, a drain and a source, said gate being coupled for receiving said fourth operating potential, said drain being coupled to said drain of said eighth transistor; and a twelfth transistor having a gate, a drain and a source, said gate being coupled for receiving said fifth operating potential, said drain being coupled to said source of said eleventh transistor, said source being coupled to a third node.

7. The voltage level translator circuit of claim 6 wherein said circuit means further includes:

a thirteenth transistor having a gate, a drain and a source, said gate being coupled for receiving said fourth operating potential, said drain being coupled to said drain of said tenth transistor; and a fourteenth transistor having a gate, a drain and a source, said gate being coupled for receiving said fifth operating potential, said drain being coupled to said source of said thirteenth transistor, said source being coupled to a fourth node.

8. The voltage level translator circuit of claim 7 wherein said circuit means further includes:

a third inverter having an input coupled to said third node and having an output coupled to said fourth node;

a fourth inverter having an input coupled to said fourth node and having an output coupled to said third node; and a fifth inverter having an input coupled to said fourth node and having an output coupled to said gate of said sixth transistor.

9. The voltage level translator circuit of claim 8 further includes:

a delay circuit having an input coupled to said second node and having an output; and a sixth inverter having an input coupled to said output of said delay circuit and having an output coupled to said gate of said first transistor.

* * * * *